(12) United States Patent
Peinovich et al.

(10) Patent No.: US 9,666,465 B2
(45) Date of Patent: May 30, 2017

(54) POSITIONING APPARATUS

(71) Applicant: SEAGATE TECHNOLOGY LLC, Cupertino, CA (US)

(72) Inventors: Daniel Peinovich, Livermore, CA (US); Samuel Lewis Tanaka, Fremont, CA (US); Thomas Larson Greenberg, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 356 days.

(21) Appl. No.: 14/105,065

(22) Filed: Dec. 12, 2013

(65) Prior Publication Data

US 2015/0165578 A1 Jun. 18, 2015

(51) Int. Cl.
*H01L 21/68* (2006.01)
*H01L 21/687* (2006.01)
*H01L 21/677* (2006.01)
*H01L 21/67* (2006.01)

(52) U.S. Cl.
CPC ........ *H01L 21/68* (2013.01); *H01L 21/67766* (2013.01); *H01L 21/67778* (2013.01); *H01L 21/68707* (2013.01); *H01L 21/67259* (2013.01); *Y10T 29/49998* (2015.01)

(58) Field of Classification Search
CPC ..... B23Q 3/18; H01L 21/68707; H01L 21/68; H01L 21/67778; H01L 21/67766; H01L 21/67259; H01L 21/67776; H01L 21/681; C23C 14/56; C23C 16/52; C23C 16/54; Y10S 414/137; Y10S 414/135; Y10S 414/141; B25J 9/042; Y10T 29/49998

USPC ............. 269/55, 56, 21; 156/345.31–345.32; 118/668, 719

See application file for complete search history.

(56) References Cited

U.S. PATENT DOCUMENTS

| | | | |
|---|---|---|---|
| 4,568,070 A * | 2/1986 | Severt | B23K 37/04 269/60 |
| 4,749,465 A | 6/1988 | Flint et al. | |
| 5,004,399 A * | 4/1991 | Sullivan | B25J 15/00 414/225.01 |
| 5,044,752 A * | 9/1991 | Thurfjell | H01L 21/67259 250/548 |
| 5,183,245 A | 2/1993 | DiNapoli et al. | |
| 5,483,138 A | 1/1996 | McGrath et al. | |
| 5,497,007 A | 3/1996 | Lee et al. | |
| 5,537,311 A | 7/1996 | Stevens | |
| 5,540,098 A * | 7/1996 | Ohsawa | H01L 21/67778 367/105 |
| 5,954,840 A * | 9/1999 | Genov | B25J 9/042 414/744.5 |
| 6,002,840 A | 12/1999 | Hofmeister | |

(Continued)

*Primary Examiner* — Larry E Waggle, Jr.
*Assistant Examiner* — Mahdi H Nejad

(57) ABSTRACT

Provided herein is an apparatus including a loader configured to position a workpiece in a holding fixture. In some embodiments, the holding fixture includes an opening configured to removably receive the workpiece therein and hold the workpiece in a target position within the opening. The apparatus also includes position detecting means configured to translate a sensor to a predetermined location relative to the holding fixture and further configured to translate the workpiece by a predetermined increment relative to the predetermined location to position the workpiece in the target position.

14 Claims, 11 Drawing Sheets

(56) References Cited

U.S. PATENT DOCUMENTS

| | | | | |
|---|---|---|---|---|
| 6,032,083 A * | 2/2000 | Oosawa | H01L 21/67778 | 700/218 |
| 6,075,334 A * | 6/2000 | Sagues | H01L 21/681 | 318/568.11 |
| 6,323,616 B1 * | 11/2001 | Sagues | B25J 9/1692 | 318/568.11 |
| 6,375,178 B1 * | 4/2002 | Schilb | B23Q 1/66 | 269/71 |
| 6,577,923 B1 | 6/2003 | White | | |
| 8,399,809 B1 | 3/2013 | Bourez | | |
| 2002/0068992 A1 * | 6/2002 | Hine | H01L 21/67259 | 700/229 |
| 2002/0079195 A1 * | 6/2002 | Kuninobu | H01L 21/681 | 198/463.3 |
| 2003/0012631 A1 * | 1/2003 | Pencis | B25J 9/0009 | 414/744.5 |
| 2005/0079042 A1 * | 4/2005 | Maeda | B25J 9/042 | 414/744.2 |
| 2005/0201424 A1 * | 9/2005 | Yoshida | H01L 21/681 | 372/9 |
| 2007/0128008 A1 * | 6/2007 | Morikawa | H01L 21/67742 | 414/217 |
| 2008/0097646 A1 * | 4/2008 | Ramsey | H01L 21/67259 | 700/258 |
| 2008/0240896 A1 * | 10/2008 | Lo | H01L 21/67259 | 414/416.03 |
| 2011/0175274 A1 * | 7/2011 | Hirano | B25J 9/0084 | 269/56 |
| 2012/0118083 A1 * | 5/2012 | Mori | H01L 21/67259 | 73/864.91 |
| 2012/0306137 A1 * | 12/2012 | Keigler | H01L 21/67028 | 269/55 |
| 2012/0325275 A1 * | 12/2012 | Goodman | B23B 31/14 | 134/149 |
| 2014/0241836 A1 * | 8/2014 | Kondoh | H01L 21/67259 | 414/226.05 |

* cited by examiner

POSITIONING APPARATUS

BACKGROUND

Generally, semiconductor substrates, such as hard disks, are manufactured by loading the substrates into different chambers of a substrate processing system. For instance, a semiconductor substrate may be loaded into a sputtering chamber, and subsequently loaded into an etching chamber, then loaded into a heating chamber, and then further loaded into a cooling chamber. To effectively process the surface of the substrate, it is appreciated that the substrate needs to be precisely positioned and located within the chamber.

SUMMARY

Provided herein is an apparatus including a loader configured to position a workpiece in a holding fixture. In some embodiments, the holding fixture includes an opening configured to removably receive the workpiece therein and hold the workpiece in a target position within the opening. The apparatus also includes position detecting means configured to translate a sensor to a predetermined location relative to the holding fixture and further configured to translate the workpiece by a predetermined increment relative to the predetermined location to position the workpiece in the target position.

These and other features and aspects of the concepts described herein may be better understood with reference to the following drawings, description, and appended claims.

DRAWINGS

DESCRIPTION

Figure 1A:
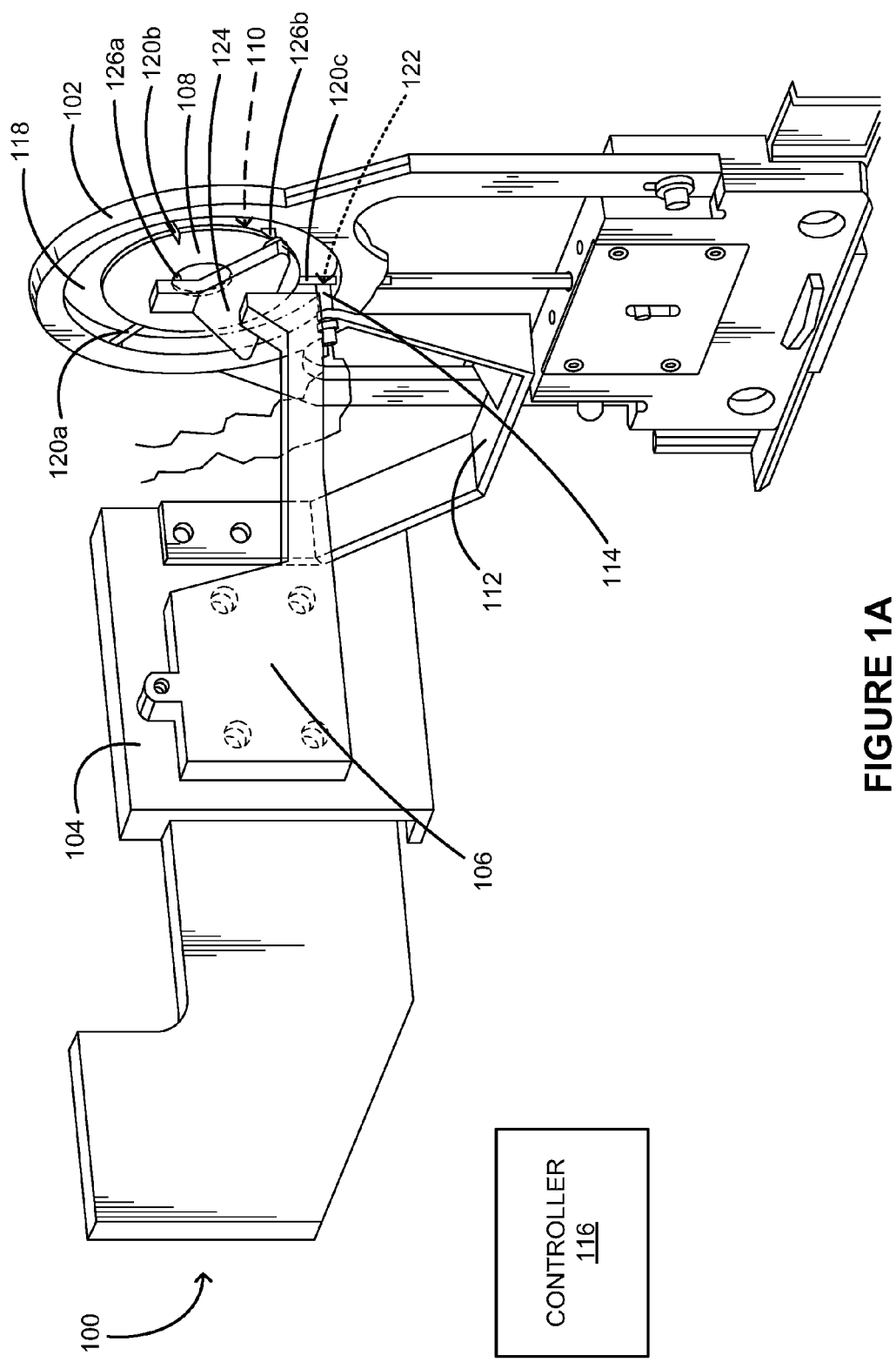
FIGS. 1A-1B show an apparatus for positioning an article in an article fixture according to one aspect of the present embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Provided herein are embodiments to reliably load and position an article (e.g. disk, disc, substrate, etc.) in a target position within a commercially available article fixture. For example, the article fixture includes a clip to hold the article in a predetermined target position, such as the center of the article fixture. To load the article in this target position, the embodiments described herein further include a sensor to detect a reference position relative to the target position, such as an edge of the clip. In this example, when the sensor contacts the edge of the clip, it is determined that the sensor is in the reference position. In response, the article is moved by a predetermined increment relative to the edge of the clip to accurately position the article in the desired target position (e.g., position the article in the center of the article fixture). By establishing contact between the sensor and the clip at the reference position, false positive indications while loading the article are substantially reduced and/or effectively eliminated. Consequently, by affirmatively identifying the location and the position of the edge of the clip, the embodiments described herein accurately load and position the article. In this way, articles are consistently, repeatably and precisely positioned in the predetermined and desired target position.

Referring now to FIG. 1A, an apparatus for positioning an article in an article fixture is shown according to one aspect of the present embodiments. Apparatus 100 includes, but is not limited to, an article fixture 102, a loader 104, an article loading arm 106 attached to the loader 104 for loading and positioning an article 108 in a target position 110 (also see FIG. 2A for clarity), a sensor arm 112, a sensor 114, and a controller 116.

Before proceeding to further describe the various components of the apparatus 100, it is appreciated that the article 108 as described herein may be, but is not limited to, semiconductor wafers, magnetic recording media (e.g., hard disks for hard disk drives), and workpieces thereof in any stage of manufacture.

Referring now to the article fixture 102, in some embodiments, the article fixture 102 may be a fixture to hold an article through one or more processing steps, such as sputtering, etching, heating, cooling, etc. The article fixture 102 includes an opening 118 that removably receives the article 108 therein and holds the article 108 in the target position 110. As illustrated in FIG. 1A, the article 108 is positioned in the target position 110. The article fixture 102 further includes clips 120*a*, 120*b* and 120*c*, which are configured to support and secure the article 108 in the target position 110 while the article 108 is being processed.

As described in greater detail below, the apparatus 100 provides a position detecting means for reliably, repeatably, and precisely positioning the article 108 in the target position 110. In FIG. 1A, the loader 104 is operably coupled to the article loading arm 106 that holds the article 108, and is operably coupled to the sensor arm 112, which holds the sensor 114. The loader 104 is configured to move the article loading arm 106 and the sensor arm 112 in a path toward and/or away from the article fixture 102 to position the article 108 and the sensor 114 in the target position 110 and a reference position 122 (also see FIG. 2A for clarity), respectively. It is noted that references will be made throughout the detailed description of the article loading arm 106 and the sensor arm 112 moving, for instance, the article 108 and the sensor 114; however, it is appreciated that in this embodiment one non-limiting example is presented wherein the movement of the article loading arm 106 and the sensor arm 108 is caused by the movement of the loader 104.

As noted above, the loader 104 is operably coupled to the article loading arm 106 that holds the article 108 while being translated toward the article fixture 102 to load the article 108 into the target position 110. The article loading arm 106 includes an article support 124 that includes multiple hooks 126*a* and 126*b* to secure the article 108 when loaded thereon. The article loading arm 106 supports the article 108 in a vertical planar position to load the article 108 in the article fixture 102. In some embodiments, the article loading arm 106 holds the article 108 in a horizontal planar position, a diagonal position, and/or some other user/system defined position.

Figure 1B:
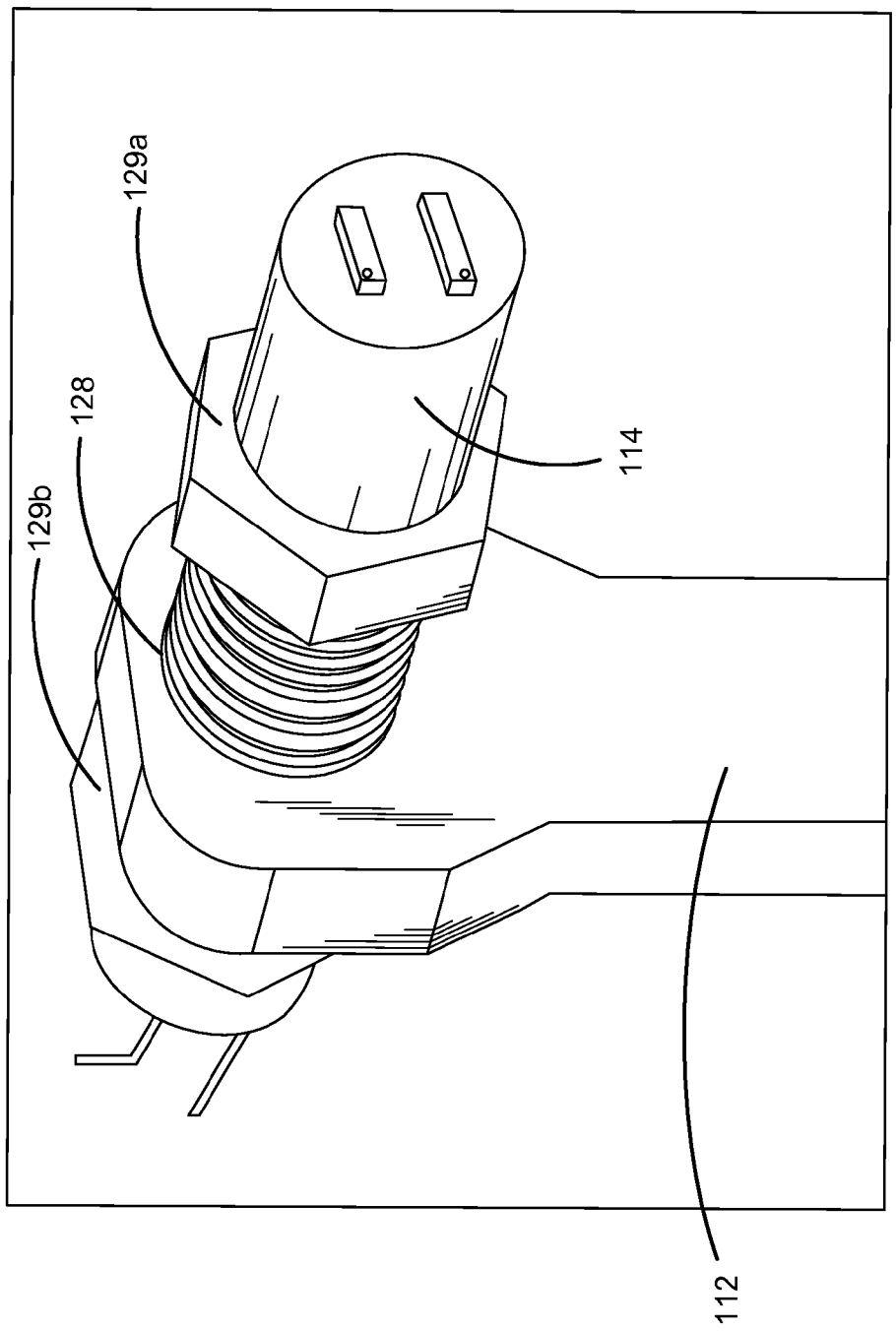

As noted above, the loader 104 is also operably coupled to the sensor arm 112. Sensor arm 112 includes the sensor 114, the body of which is secured and positioned within a through hole 128 of the sensor arm 112, as illustrated in FIG. 1B. In FIG. 1B, the sensor 114 further includes fasteners (e.g. nuts 129*a* and 129*b*) to keep the sensor 114 in place while the sensor arm 112 translates toward and away from the article fixture 102. Various embodiments may include any fastener (e.g. bolt, screw, weld, glue, adhesive, etc.) operable to secure the sensor 144 in a predetermined position while the sensor arm 112 translates.

Returning to FIG. 1A, in some instances, the sensor arm 112 translates the sensor 114 toward the article fixture 102 until the sensor 114 is in the reference position 122. The sensor 114 is determined to be in the reference position 122 when the sensor 114 establishes contact with a selected portion of the article fixture 102, such as a near edge of the clip 120*c* as illustrated in FIG. 1A. In some instances, the sensor 114 is determined to be in the reference position 122 when the sensor 114 closes an electrical circuit, which is described in greater detail in connection with FIGS. 2A-2F.

Once it is determined that the sensor 114 is in the reference position 122, it is appreciated that the position of the article 108 may need to be further adjusted to position the article 108 in the target position 110. In some instances, the sensor arm 112 moves the article 108 toward the target position 110 by a predetermined increment relative to the reference position 122, which is described in greater detail in connection with FIGS. 2A-2F. It is appreciated that once the sensor 114 is in the reference position 122, the reference position 122 provides a known positional/locational relationship with the target position 110 that allows the apparatus 100 to repeatably and precisely locate and load the article 108 in the target position 110.

The apparatus 100 further includes the controller 116. In some embodiments, the controller 116 is communicatively coupled (not shown) to the loader 104 to cause the loader 104 to translate in a path toward and/or away from the article fixture 102. In some instances, the controller 116 includes a motion control system, such as a stepper motor, electric motor, linear actuator, hydraulic pump, and so forth, that causes the loader 104 to automatically translate by certain distances or by specific, predetermined, and/or calculated increments. It is appreciated that when the controller 116 causes the loader 104 to move, the controller 116 further causes the movement of the article loading arm 106 along with the article 108, the sensor arm 112, and the sensor 114.

In some embodiments, the controller 116 includes a computer, such as a desktop computer, a workstation, a portable device (e.g., a mobile device, a tablet, a laptop, or a smartphone), or some computing device configured to automatically cause an article to be positioned in a target position. In some instances, the controller 116 is programmed and/or reprogrammed by a user/system that defines the reference position, the target position, and/or the predetermined increments to adjust the article into the target position. By being able to program the controller 116 for various features, it is appreciated that the apparatus 100 provides the convenience and flexibility to adjust the apparatus 100 without much downtown and/or manual adjustments.

Referring now to FIGS. 2A-2F, sequential illustrations of an apparatus positioning an article in an article fixture is shown according to aspects of the present embodiments. For clarity of illustration, clips 120*a*, 120*b*, and 120*c* are not illustrated in FIG. 2A, however the clips are illustrated in FIGS. 2B-2F. Specifically, FIGS. 2A-2F show sequential illustrations of positioning an article, such as the article 108, by translating the sensor 114 until contact is established between the sensor 114 and a near edge of the clip 120*c* (e.g., the reference position 122 illustrated with dashed lines), and then, if appropriate, further positioning the article 108 in a vertical planar position in the center of the opening 118 of the article fixture 102 (e.g., the target position 110 illustrated with dashed lines).

Figure 2A:
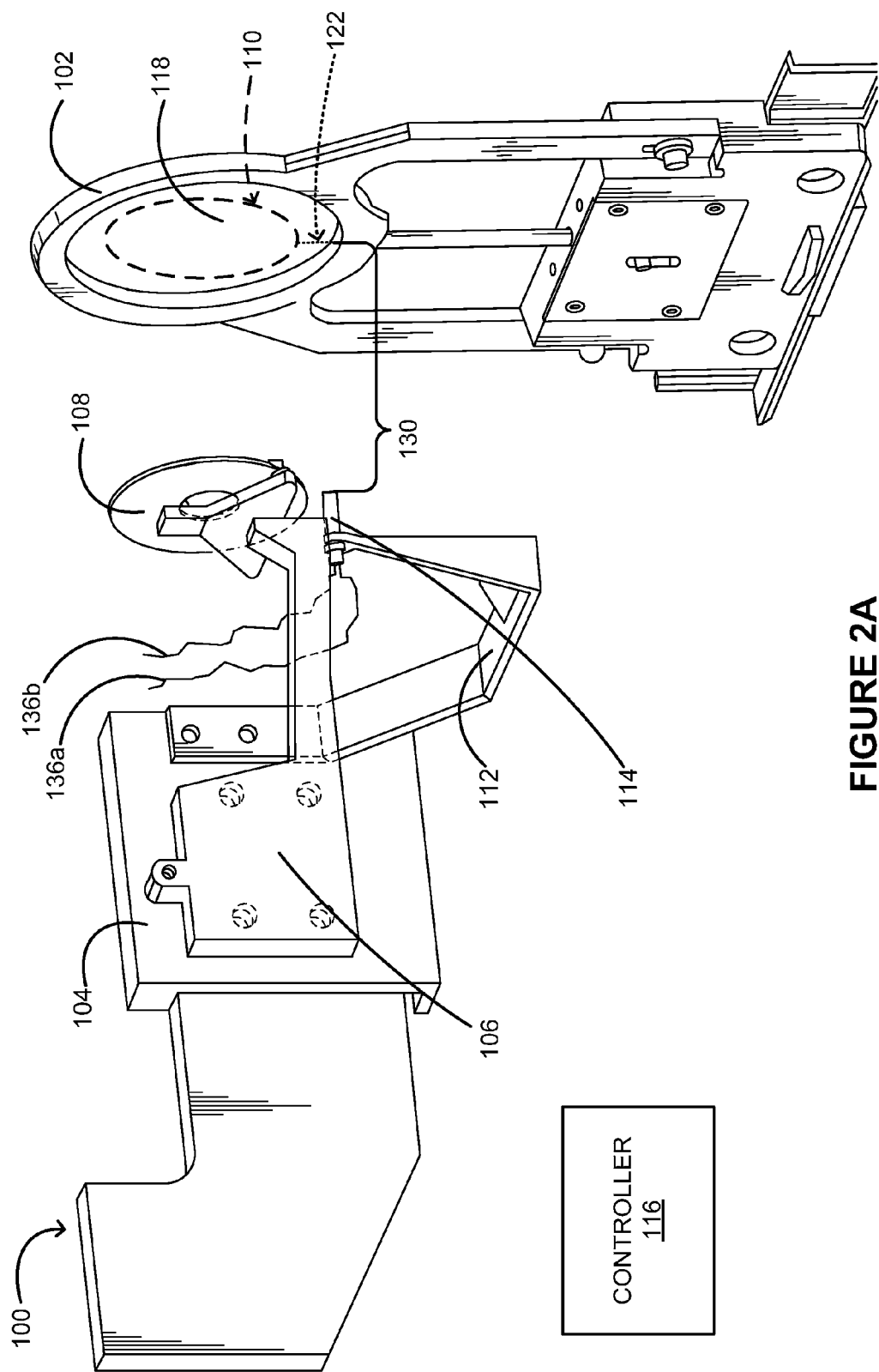
FIGS. 2A-2F show sequential illustrations of an apparatus positioning an article in an article fixture according to aspects of the present embodiments.
Figure 2B:
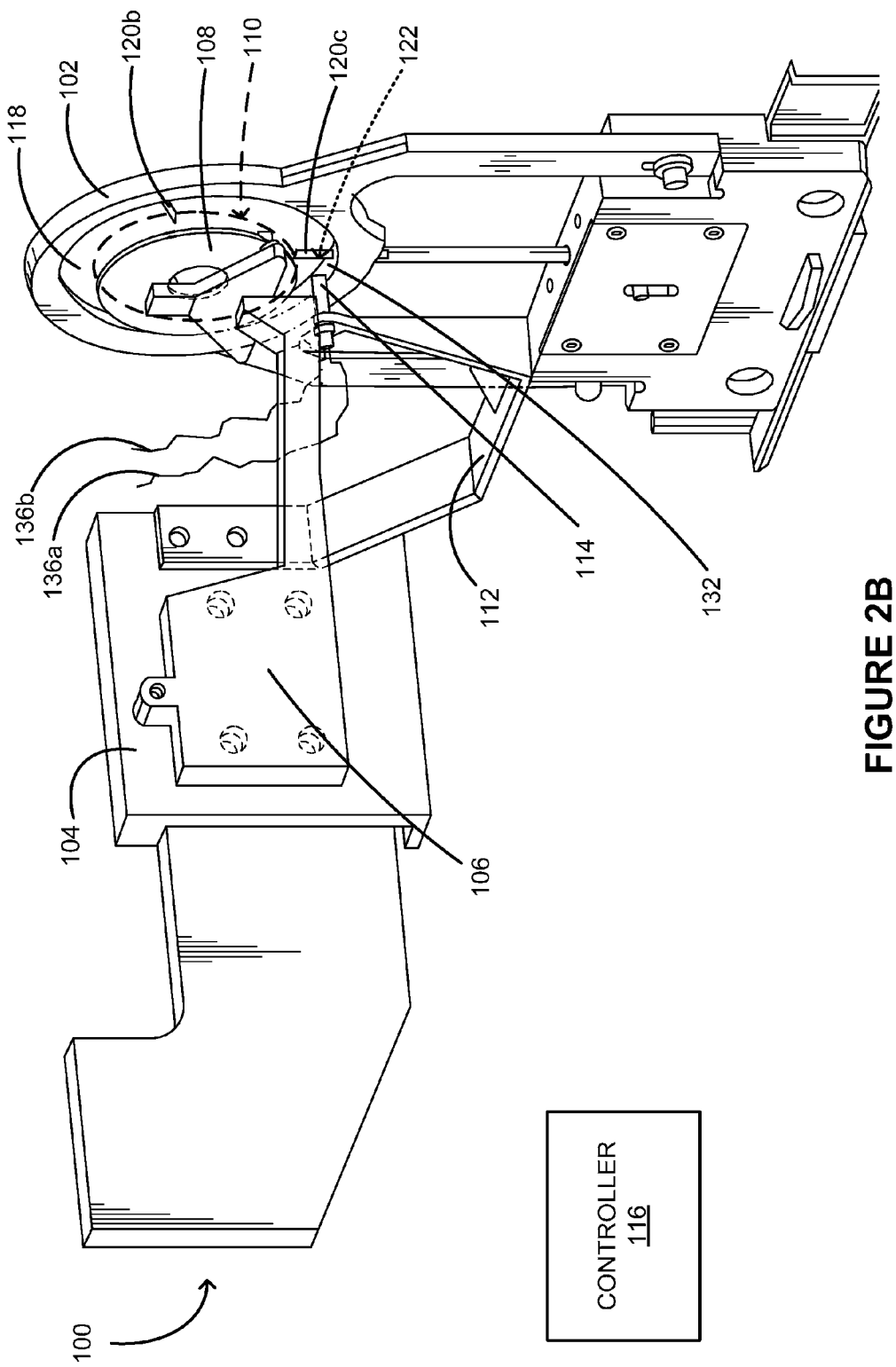

FIG. 2A shows the apparatus 100 positioned in an initial position to load the article 108 in the article fixture 102. Specifically, in FIG. 2A, the article 108 is supported by the article loading arm 106 in a vertical planar position facing the opening 118 and the sensor 114 positioned in an initial position, which is a position located at a predetermined distance 130 away from the reference position 122. In order to efficiently locate the reference position 122 and ultimately position the article 108 in the target position 110, the controller 116 then causes the sensor arm 112 to quickly translate the sensor 114 from the initial location as illustrated in FIG. 2A to a location in closer proximity to the reference position 122, e.g., near the edge of the clip 120*c*, as shown in FIG. 2B. Once the sensor 114 is at a location at or past the location of closer proximity to the reference position 122, the controller 116 then slows down the movement of the sensor 114 until the sensor 114 is in the reference position 122, as shown in FIG. 2E.

Figure 2C:
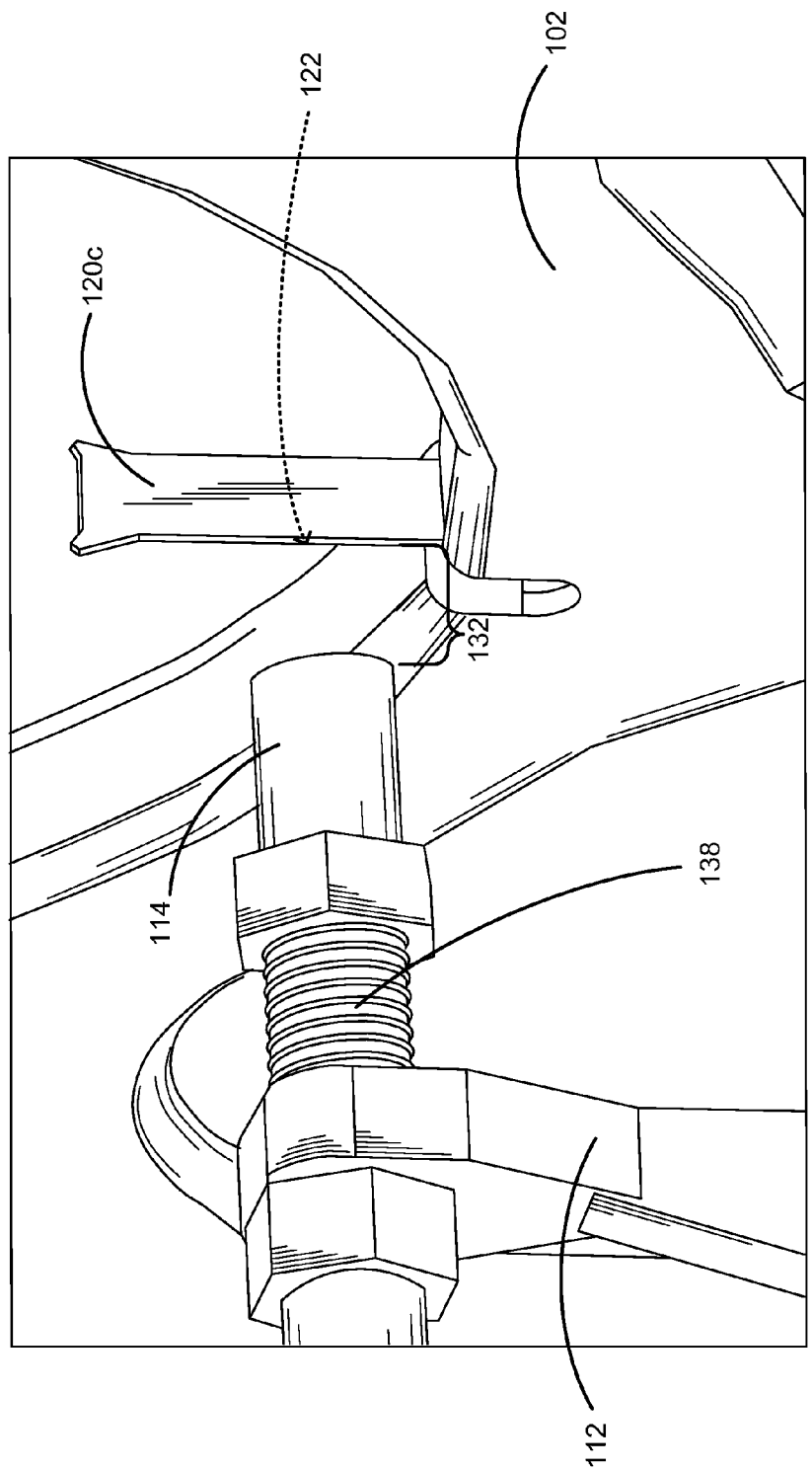

More particularly, in this example, the sensor arm 112 moves the sensor 114 from the initial position as illustrated in FIG. 2A at a first speed to quickly translate the sensor 114 to a location that is closer than the initial position to the edge of the clip 120*c*, such as distance 132 as illustrated in FIGS. 2B and 2C. Once the sensor 114 is at the distance 132 or less from the clip 120*c*, the sensor arm 112 moves the sensor 114 at a slower speed until the sensor 114 establishes contact with the edge of the clip 120c. By slowing the movement speed of the sensor 114, the movement of the sensor 114 and the sensor arm 112 may quickly come to a stop when contact is established between the sensor 114 and the near edge of clip 120c.

It is appreciated that by initially moving the sensor 114 at a faster speed and then moving the sensor 114 at a slower speed, certain efficiencies may be achieved. Because the reference position 122 (e.g., the near edge of the clip 120c) is a known position relative to the sensor's 114 initial position as illustrated in FIG. 2A, the sensor 114 is initially moved at a faster speed to proximately position the sensor 114 near the actual reference position 122, which allows the sensor 114 to be accurately positioned in the reference position 122 in a shorter amount of time than if a single positioning speed (whether faster or slower) were employed. More specifically, a slower speed takes longer to reach the reference position 122; a faster speed makes undershooting or overshooting the reference position 122 more likely. Therefore, by utilizing the dual speed approach as taught herein, an article may be efficiently and accurately loaded into a target position in a minimal amount of time.

As noted above, the sensor arm 112 continues to translate the sensor 114 toward the article fixture 102 until the sensor 114 is in the reference position 122. In other words, the sensor arm 112 moves the sensor 114 until the sensor 114 establishes contact with the near edge of the clip 120c. Here, contact is determined to be established when a surface of the sensor 114 and the edge of the clip 120c closes an electrical circuit, which is described in greater detail below in connection with FIG. 2D.

Figure 2D:
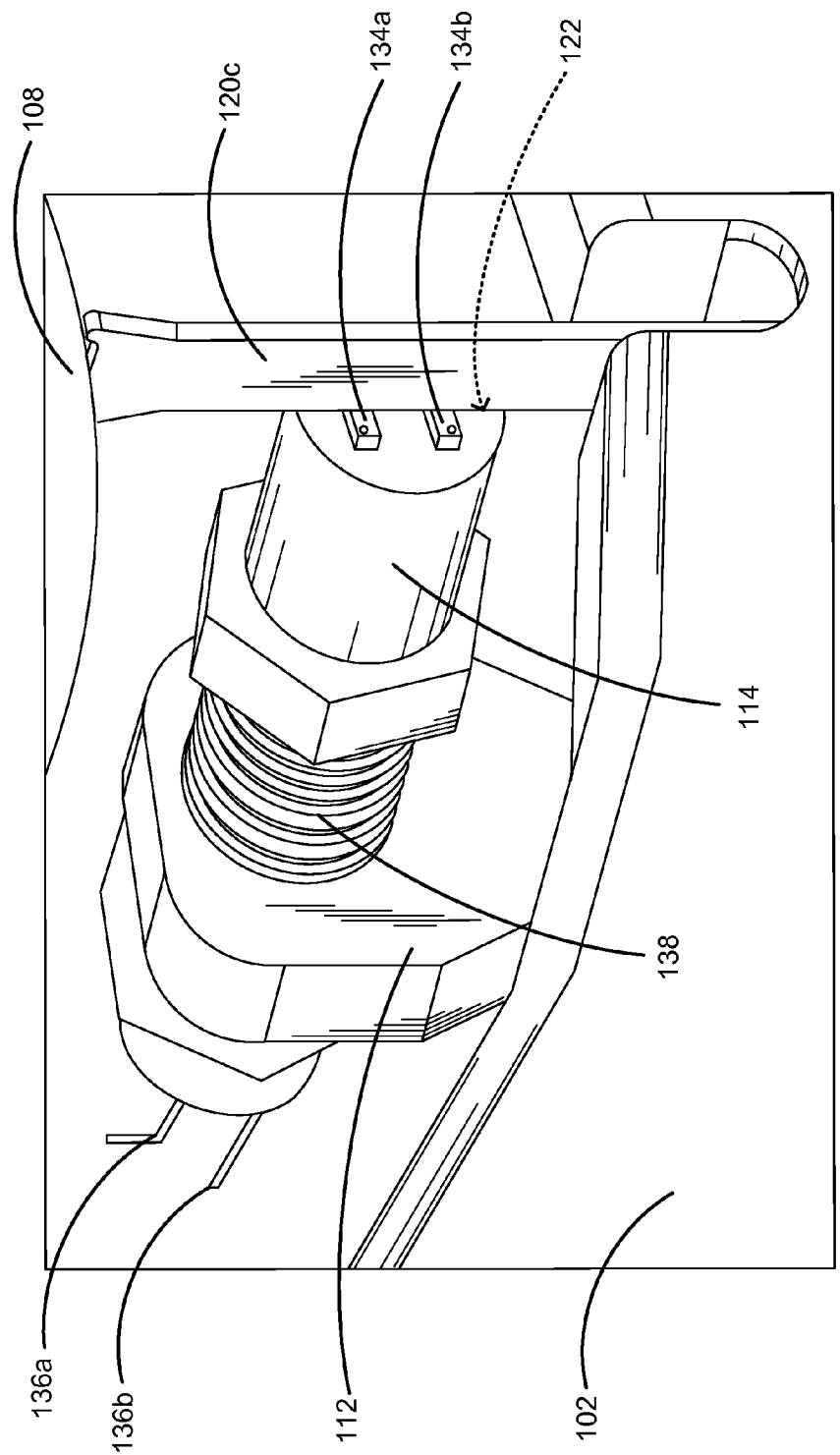
Figure 2E:
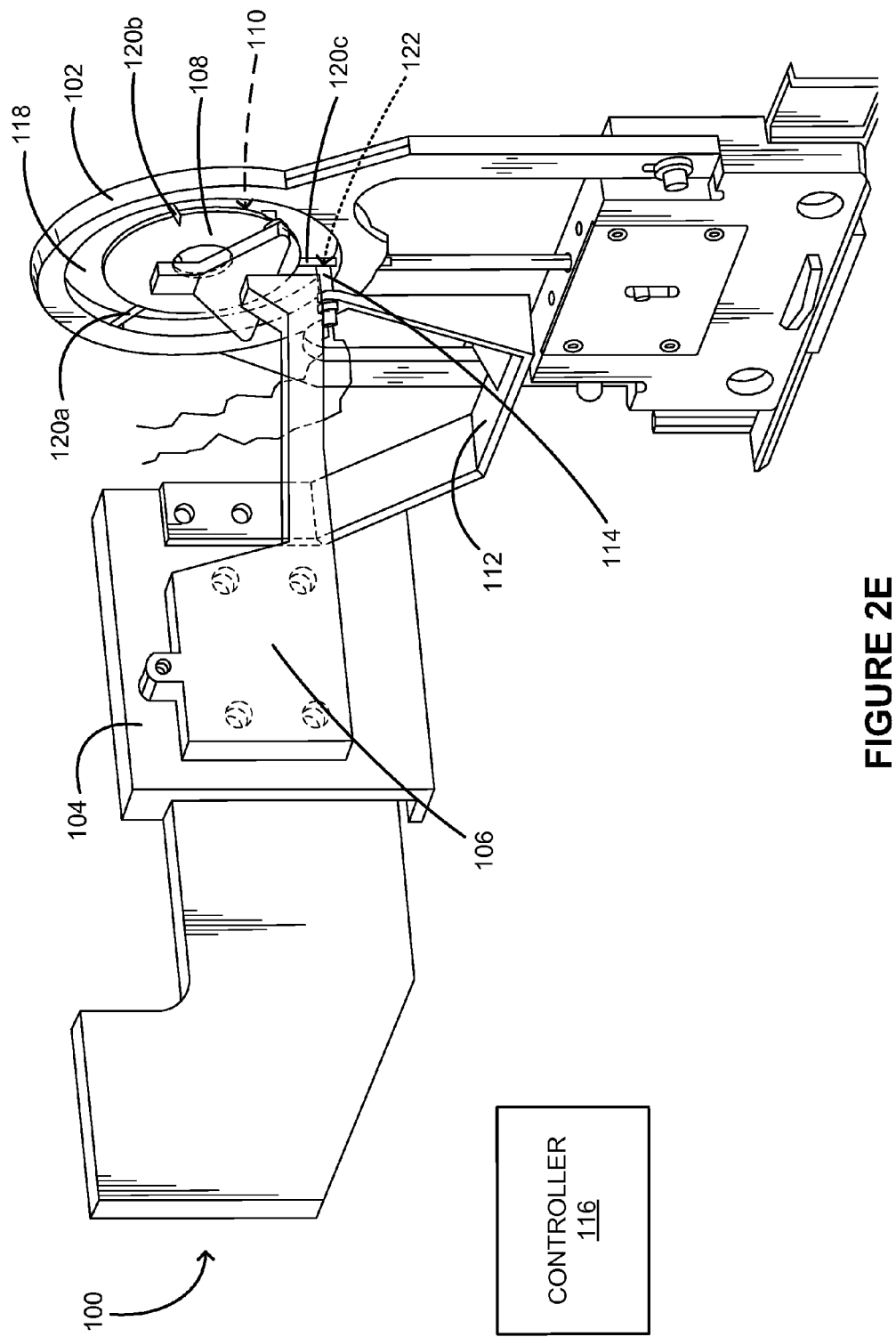

In FIG. 2D, the sensor 114 includes electrical contacts 134a and 134b and electrical transmission conductors 136a and 136b coupled to the controller 116 (not shown). In some instances, the electrical contacts 134a and 134b may be of an electrically conductive material, such as silver, gold, copper, stainless steel, titanium, platinum, Inconel, and so forth. In some instances, the electrical contacts 134a and 134b may be of a material that is electrically conductive and a material that leaves little to no residue upon contact with the clip 120c, to prevent contamination of the article 108 during processing. Further, in some instances, the surface of the clip 120c may be of an electrically conductive material other than a metal. For example, the surface of the clip 120c may be coated with a diamond-like carbon (DLC) coating.

In such an arrangement, the controller 116 supplies a certain amount of voltage, such as 24 volts (V), to the sensor 114 via the electrical transmission conductors 136a and 136b. As such, when the electrical contacts 134a and 134b contact the near edge of the clip 120c, a complete electrical circuit is formed back to the controller 116. When the controller 116 receives the contact-confirming electrical signal, then it is determined that the sensor 114 is in the reference position 122, and no longer needs to be continued to be moved toward the reference position 122.

However, it is appreciated that, in some instances, the sensor arm 112 may nominally overtravel during movement of the sensor 114 into the reference position 122. That is, the momentum of the loader 104, after the loader 104 is told by the controller 116 to stop, may cause the loader 104 and the sensor arm 112 to continue to move a nominal distance after the sensor 114 has established contact with the near edge of the clip 120. In such a scenario, if the sensor arm 112 continues to move after the sensor 114 is in contact with the clip 120c, the sensor arm 112 and the sensor 114 may apply strain and pressure on the clip 120c and possibly damage the clip 120c.

Accordingly, to prevent damage to the clip 120c, the sensor 114 includes a means for absorbing an overtravel by the sensor arm 112 as the sensor 114 is moved into the reference position 122. In some instances, the means for absorbing may include a spring, such as spring 138 as shown in FIGS. 2C and 2D, that permits the sensor 114 to retract relative to the sensor arm 112 whenever the sensor arm 112 overtravels during movement into the reference position 122. In some instances, the spring 138 may be a steel spring. In some embodiments, the means for absorbing may include a shock suspension pump, a dashpot, or some other device that may be used to absorb an overtravel by the sensor arm 112. In this way, the means for absorbing provides a mechanism for contact-based positioning while preventing damage to the article fixture 102.

Once contact is established between the sensor 114 and the near edge of the clip 120c, the sensor 114 is in the reference position 122 as illustrated in FIG. 2E. It is appreciated that after the sensor 114 is moved into the reference position 122, the article 108 may not be in the target position 110. As such, in some embodiments, the article 108 is moved by a predetermined increment relative to the reference position 122 to position the article 108 into the target position 110. For instance, the predetermined increment may be based on the relative distance between the reference position 122 and the target position 110. For example, if it is known that the target position 110 is a distance X away from the reference position 122, then the loader 104 translates the article 108 by predetermined increments based on distance X. For instance, the loader 104 may translate the article 108 by 2 increments of 0.5X, or by 1 increment of X, etc., toward the target position 110.

In some instances, the reference position may be coincident with the target position, and as such, the predetermined increment may be null. In other words, the article 108 is placed into the target position 110 simultaneously as the sensor 114 is placed into the reference position 122. This is in contrast with other instances in which the reference position may not be coincident with the target position, and the predetermined increment will be greater than null.

Figure 2F:
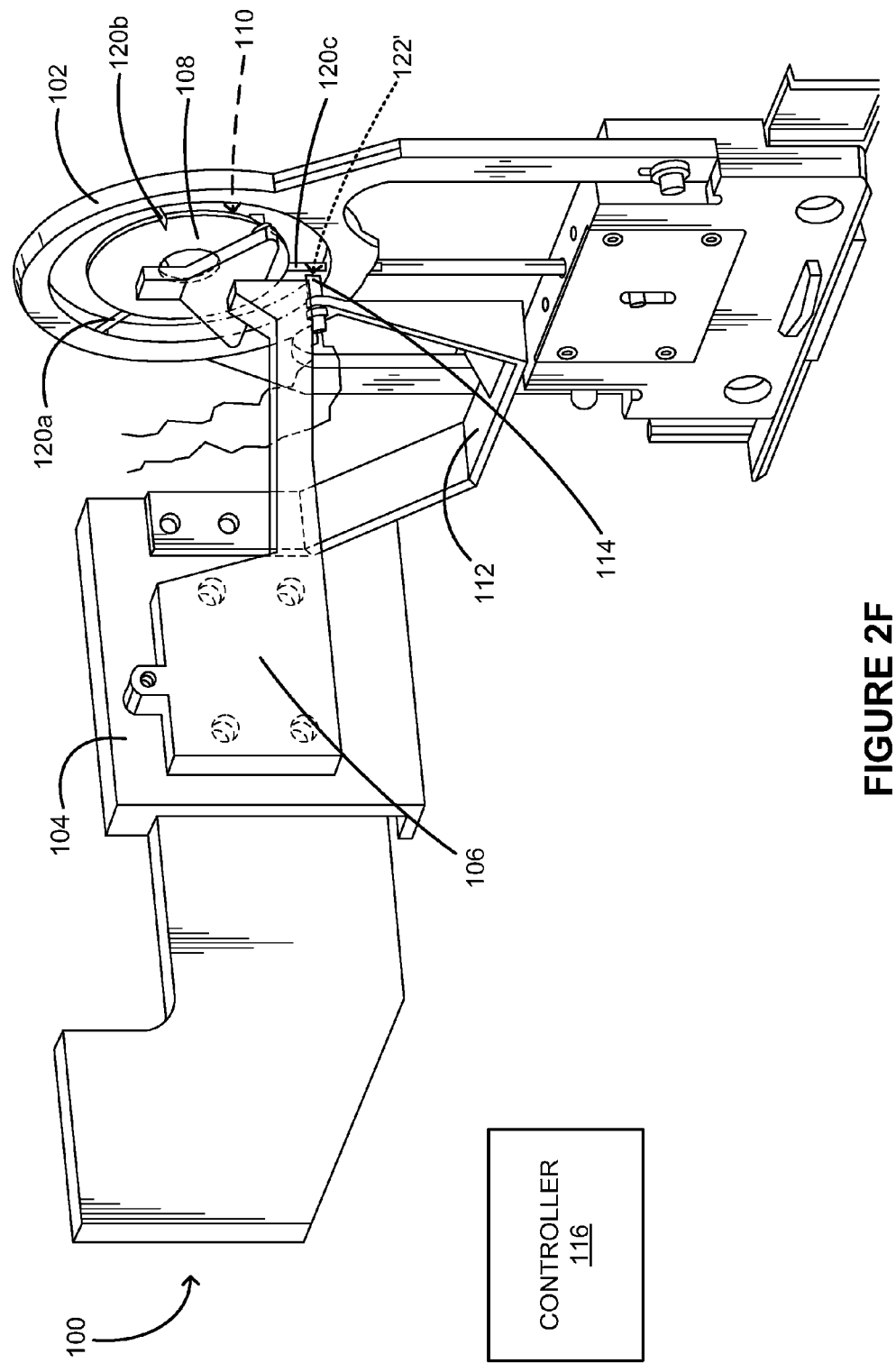

In some alternative embodiments, the article 108 is moved toward the target position 110 by breaking contact between the sensor 114 and the near edge of the clip 120c after contact has first been made, as illustrated in FIG. 2F. In such a scenario, the controller 116 causes the loader 104 to move the sensor 114 in reverse by a predetermined increment after the circuit formed by the sensor 114 and the clip 120c opens. In some instances, the predetermined increment may include a number of subsequential incremental movements to break contact between the sensor 114 and the clip 120c. In this instance, as the contact is broken, the loader 104 then moves the article 108 into the target position 110. For example, if three increments of a stepper motor step are used to break contact between the sensor 114 and the clip 120c, then the sensor 114 and the article 108 are moved by three increments relative to the reference position 122' to place the article in the target position 110. Once the circuit opens and the return signal voltage is removed from the controller 116, it is determined that the contact between the sensor 114 and the clip 120c has been broken, and thus, article 108 can be accurately positioned in the target position 110.

After the article 108 is positioned in the target position 110, the article loading arm 106 releases the article 108. Then, the loader 104 retracts the sensor arm 112 along with the sensor 114 and the article loading arm 106 away from the article fixture 102, and then the article 108 is processed within the article fixture 102.

Although FIG. 1A and FIGS. 2A-2F illustrate the article fixture 102 with a circular opening, it is intended to be exemplary and is not intended to limit the scope of the embodiments. In some embodiments, the opening may be a square or rectangular shaped opening. In some embodiments, the shape of the opening may be dependent on the type of article being processed. It is further appreciated that the illustration in FIG. 1A and FIGS. 2B-2F of three clips (e.g., clips 120a, 120b and 120c) is illustrative and is not intended to limit the scope of the embodiments described herein. In some embodiments, the article fixture described herein may have fewer than or more than three clips. In some embodiments, the article fixture 102 may have no clips, and an article may be supported by a rim of the article fixture instead. In some embodiments, the article fixture 102 may include a cradle that supports an article within the opening, rather than clips.

Further, it is appreciated that the illustration in FIG. 1A and FIGS. 2A-2F of the target position as a centered vertical planar position within the article fixture is intended to be exemplary and is not intended to limit the scope of the embodiments. It is appreciated that in some embodiments, the target position may be an off-centered vertical planar position, a centered horizontal position, and/or a user/system defined position that is optimal for processing the article during sputtering, etching, etc.

Figure 3:
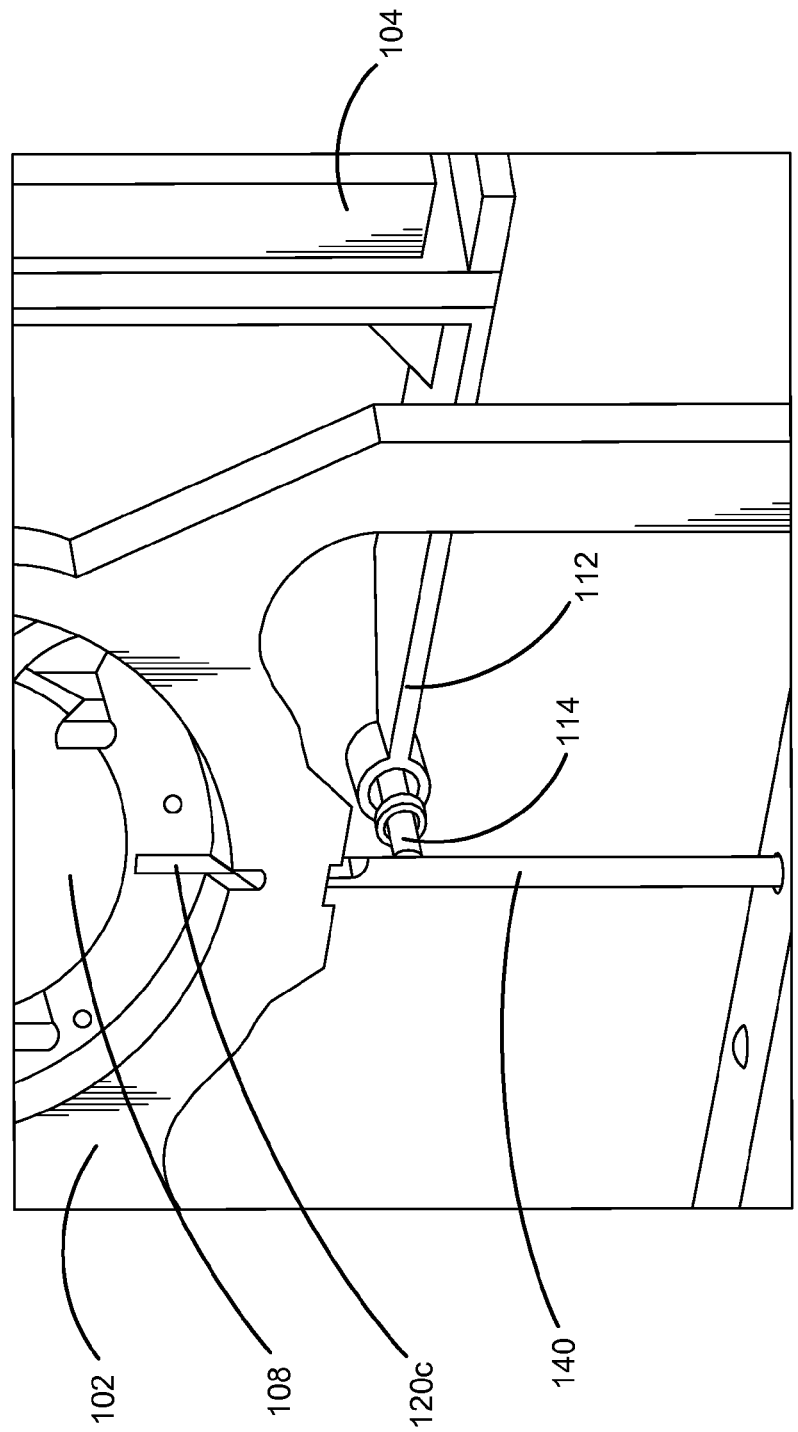
FIG. 3 shows a portion of an apparatus for positioning an article in an article fixture according to one aspect of the present embodiments.

In FIG. 1A and FIGS. 2A-2F, the discussion of the reference position with respect to the near edge of clip 120c is intended to be exemplary and is not intended to limit the scope of the embodiments. In some embodiments, the clip 120a, the clip 120b and/or all the clips 120a, 120b and 120c may be used as a reference position to position an article into a target position. In some embodiments, for example, the reference position may be a support beam, such as support beam 140 as shown in FIG. 3. In one example, the reference position may be on a location on the rim of the opening 118. In some instances, the reference position may be anywhere on or a known position relative to the article fixture 102, whether the reference position is near thereto or remotely located with reference to the apparatus 100. It is appreciated that the reference position may be a user/system defined position that provides a frame of reference to predictably locate and position an article in a target position.

Figure 4:
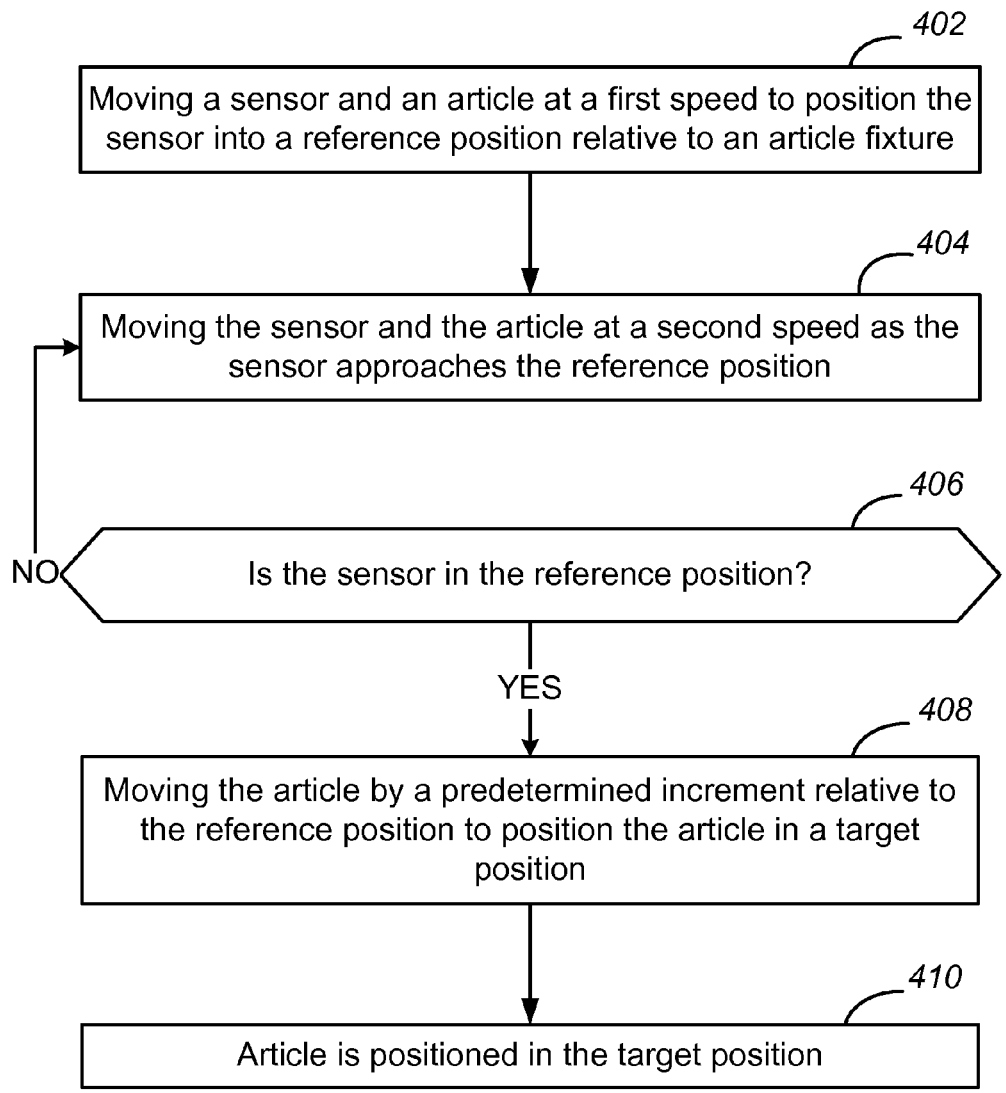
FIG. 4 shows an exemplary flow diagram for positioning an article according to one aspect of the present embodiments.

FIG. 4 shows an exemplary flow diagram for positioning an article according to one aspect of the present embodiments. At block 402, a sensor and an article are moved at a first speed to position the sensor into a reference position relative to an article fixture. In some embodiments, the sensor and article may be substantially similar to the sensor 114 and the article 108. In some embodiments, the sensor and the article may be moved by a predetermined distance from an initial position to position the sensor in a location in closer proximity to a reference position, such as an edge of a clip as described herein. In some embodiments, the sensor and article may be moved in a substantially similar manner as described in FIGS. 2A-2F. In some embodiments, the first speed may be some user/system defined speed that allows the sensor to be in a location in closer proximity to the reference position in a short period of time.

At block 404, the sensor and the article are moved at a second speed as the sensor approaches the reference position. For instance, the sensor and the article may be moved at a second speed that is slower in comparison to the first speed in block 402 as the sensor comes into closer proximity to the reference position. In some embodiments, the sensor and the article are moved in a substantially similar manner, as described in FIGS. 2A-2F.

At block 406, it is determined whether the sensor is in the reference position. In some embodiments, the sensor is determined to be in the reference position when contact is established between the sensor and a portion of an article fixture, such as an edge of a clip and/or a support beam of the article fixture. In some embodiments, the sensor is determined to be in the reference position when the sensor closes a circuit when in contact with an electrically conductive portion of the article fixture and/or when in contact to an electrically conductive surface located in a relatively known position with respect to the article fixture and/or the target position. In some embodiments, the determination is performed in a substantially similar manner as described in FIG. 1A and FIGS. 2A-2F.

In some embodiments, if it is determined that the sensor is not in the reference position, then method 400 returns to block 404 to continue to move the sensor and the article at the second speed as the sensor approaches the reference position. Otherwise, method 400 proceeds to block 408.

At block 408, the article is moved by a predetermined increment relative to the reference position to position the article in a target position. In some embodiments, the article may be moved by a loader, such as loader 104, by the predetermined increment to position the article in the target position. In some embodiments, the article is moved by a predetermined increment in a substantially similar manner as described in FIG. 1A and FIGS. 2A-2F. Once the article is moved by the predetermined increment, then the article is positioned in the target position (block 410).

Figure 5:
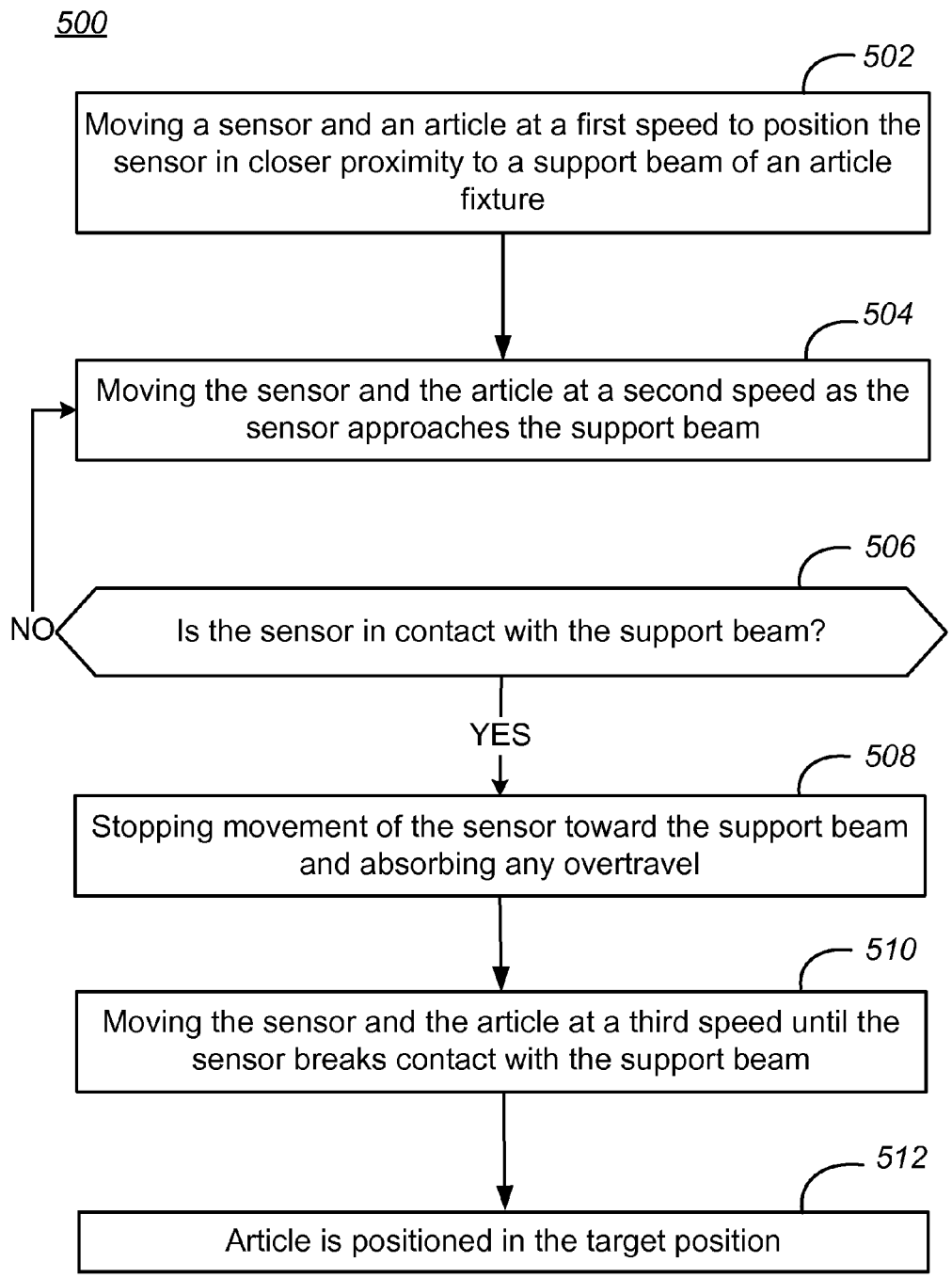
FIG. 5 shows an exemplary flow diagram for positioning an article according to one aspect of the present embodiments.

FIG. 5 shows an exemplary flow diagram for positioning an article according to one aspect of the present embodiments. At block 502, a sensor and an article are moved at a first speed to position the sensor in closer proximity to a support beam of an article fixture. In some embodiments, the sensor and the article may be moved by a predetermined increment from an initial position, such as the initial position described in FIG. 2A, to position the sensor in a location in closer proximity to the support beam, such as support beam 140. As noted in block 402 of FIG. 4, the first speed may be some user/system defined speed that allows the sensor to be in a location in closer proximity to the support beam in a short period of time.

At block 504, the sensor and the article are moved at a second speed as the sensor approaches the support beam. Similar to block 404 of FIG. 4, the sensor and the article may be moved at a second speed that is slower in comparison to the first speed in block 502 as the sensor comes into closer proximity to the support beam.

At block 506, it is determined whether the sensor is in contact with the support beam (i.e., in the reference position). In some embodiments as described herein, the sensor is determined to be in contact with the support beam when the sensor forms a closed circuit with the support beam. For instance, when a controller as described herein receives a contact-confirming electrical signal, then it is determined that the sensor is contact with the support beam.

In some embodiments, if it is determined that the sensor is not in contact with the support beam, the method 500 returns to block 504 to continue to move the sensor and the article at the second speed. Otherwise, method 500 proceeds to block 508 to stop the movement of the sensor toward the support beam. For instance, a controller as described herein may signal a loader and/or a sensor arm to stop the movement of the sensor. However, it is appreciated that a sensor arm and/or loader as described herein may nominally overtravel after the sensor is in contact with the support beam. As such, if there is any overtravel, the overtravel is absorbed. In some instances, the sensor includes a means for absorbing an overtravel, such as spring 138.

At block 510, the sensor and the article are moved at a third speed until the sensor breaks contact with the support beam. In some embodiments, the sensor and the article are moved by a predetermined increment in a similar manner as described in FIGS. 2E-2F. In some embodiments, it is determined that contact between the sensor and the support beam is broken when the circuit formed by the sensor and the support beam opens. In some embodiments, the third speed may be a slower speed in comparison to the first speed and the second speed of blocks 502 and 504, respectively. It is appreciated that by slowing the movement of the sensor and the article, the article may be positioned in the target position without undershooting or overshooting the target position. Once contact between the sensor and the support beam is broken, then the article is positioned in the target position (block 512).

As such, provided herein is an apparatus including an article fixture configured to hold an article in a predetermined target position, a loader configured to position the article in the target position, and a sensor arm including a sensor and operably connected to be moved by the loader as the loader positions the article. In some embodiments, the loader is configured to move the sensor into a reference position, and to move the sensor by a predetermined increment relative to the reference position to cause the loader to position the article in the target position.

In some embodiments, the reference position is coincident with the target position; and the predetermined increment is null. In some embodiments, the sensor is configured to be in the reference position when contact is established between the sensor and a surface of the article fixture. In some embodiments, the sensor arm is configured to move the sensor by the predetermined increment relative to contact between the sensor and the surface of the article fixture.

In some embodiments, the sensor arm is configured to move the sensor by a first predetermined distance at a first speed from an initial location to a location in closer proximity to the reference position, and the sensor arm is further configured to move the sensor to the reference position at a second speed when the sensor is at or past the location in closer proximity to the reference position. In some embodiments, the first speed is faster in comparison to the second speed.

In some embodiments, the sensor includes electrical contacts configured to contact a surface of the article fixture when the sensor is in the reference position, the surface of the article fixture that is in contact is electrically conductive, and the contact between the sensor and the electrically conductive article fixture surface closes an electrical circuit.

In some embodiments, the apparatus further includes means for absorbing an overtravel by the sensor arm as the sensor is moved into the reference position. The means for absorbing further includes a spring for the sensor that is configured to permit the sensor to retract relative to the sensor arm whenever the sensor arm overtravels during movement into the reference position, in some embodiments.

Also provided herein is an apparatus including a loader configured to position a workpiece in a holding fixture. In some embodiments, the holding fixture includes an opening configured to removably receive the workpiece therein and hold the workpiece in a target position within the opening. The apparatus also includes position detecting means configured to translate a sensor to a predetermined location relative to the holding fixture and further configured to translate the workpiece by a predetermined increment relative to the predetermined location to position the workpiece in the target position.

In some embodiments, the position detecting means includes a workpiece loader configured to load the workpiece in the holding fixture in the target position. The position detecting means further includes a sensor arm that includes the sensor and operably connected to be moved by the loader, and configured to translate the sensor to the predetermined location and further configured to move the sensor by the predetermined increment to cause the workpiece loader to load the workpiece in the target position, in some embodiments. In some embodiments, the holding fixture includes a clip configured to support the workpiece in the target position, and the sensor is translated to the predetermined location when the sensor is in contact with a portion of the clip. In some embodiments, the predetermined location is coincident with the target position, and the predetermined increment is null.

In some embodiments, the position detecting means is further configured to translate the sensor by a first predetermined distance at a first speed from an initial location to a location in closer proximity to the predetermined location, and translate the sensor to the predetermined location at a second speed when the sensor is at or past the location in closer proximity to the predetermined location. In some embodiments, the first speed is faster in comparison to the second speed.

Also provided herein is a method including moving a sensor and an article at a first speed to position the sensor into a reference position relative to an article fixture, moving the sensor and the article at a second speed as the sensor approaches the reference position, determining when the sensor is in the reference position, and moving the article by a predetermined increment relative to the reference position to position the article in a target position in response to determining that the sensor is in the reference position.

In some embodiments, moving at the first speed is faster in comparison to moving at the second speed. In some embodiments, determining when the sensor is in the reference position includes determining when a portion of the sensor comes into contact with a portion of the article fixture.

In some embodiments, the method further includes moving the sensor by the predetermined increment in response to determining that the sensor is in the reference position. In some embodiments, positioning the sensor in the reference position includes establishing contact between the sensor and a portion of the article fixture, and moving the sensor by the predetermined increment includes removing contact between the sensor and the article fixture.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
a fixture configured to hold a recording media in a predetermined target position;
a loader configured to position the recording media in the target position in the fixture; and
a sensor arm including a sensor and operably connected to be moved by the loader as the loader positions the recording media in the fixture,
the loader being configured:
to move the sensor into a reference position, with respect to a portion of the fixture, wherein the sensor detects the reference position while holding the recording media, and wherein further the sensor is configured to be in the reference position when a contact is established between the sensor and a surface of the fixture, and
to move the sensor by a predetermined increment relative to the reference position to cause the loader to position the recording media in the target position in the fixture.

2. The apparatus of claim 1, wherein
the reference position is coincident with the target position; and
the predetermined increment is null.

3. The apparatus of claim 1, wherein the sensor arm is configured to move the sensor by the predetermined increment relative to the contact between the sensor and the surface of the fixture.

4. The apparatus of claim 1, wherein
the sensor arm is configured to move the sensor by a first predetermined distance at a first speed from an initial location to a location in closer proximity to the reference position; and
the sensor arm is further configured to move the sensor to the reference position at a second speed when the sensor is at or past the location in closer proximity to the reference position.

5. The apparatus of claim 4, wherein the first speed is faster in comparison to the second speed.

6. The apparatus of claim 1, wherein
the sensor includes electrical contacts configured to contact the surface of the fixture when the sensor is in the reference position;
the surface of the fixture that is in contact is electrically conductive; and
the contact between the sensor and the electrically conductive fixture surface closes an electrical circuit.

7. The apparatus of claim 1 further comprising:
means for absorbing an overtravel by the sensor arm as the sensor is moved into the reference position.

8. The apparatus of claim 7, wherein the means for absorbing further comprises a spring for the sensor that is configured to permit the sensor to retract relative to the sensor arm whenever the sensor arm overtravels during movement into the reference position.

9. An apparatus comprising:
a loader configured to position a workpiece in a holding fixture, the holding fixture including an opening configured to removably receive the workpiece therein and hold the workpiece in a target position within the opening; and
a sensor, wherein
the sensor is positioned to establish contact with the holding fixture, and
the loader is configured to translate the sensor to a predetermined location relative to the holding fixture, wherein the sensor establishes a contact with the holding fixture at the predetermined location, and the loader is further configured to translate the workpiece by a predetermined increment relative to the predetermined location to position the workpiece in the target position, wherein the sensor maintains the contact with the holding fixture during translation of the workpiece to the target position.

10. The apparatus of claim 9, further comprising
a sensor arm that includes the sensor and operably connected to be moved by the loader, and configured to translate the sensor to the predetermined location and further configured to move the sensor by the predetermined increment to cause the workpiece loader to load the workpiece in the target position.

11. The apparatus of claim 9, wherein
the holding fixture includes a clip configured to support the workpiece in the target position; and
the sensor is translated to the predetermined location when the sensor is in contact with a portion of the clip.

12. The apparatus of claim 9, wherein
the predetermined location is coincident with the target position; and
the predetermined increment is null.

13. The apparatus of claim 9, wherein the loader is further configured to:
translate the sensor by a first predetermined distance at a first speed from an initial location to a location in closer proximity to the predetermined location; and
translate the sensor to the predetermined location at a second speed when the sensor is at or past the location in closer proximity to the predetermined location.

14. The apparatus of claim 13, wherein the first speed is faster in comparison to the second speed.

* * * * *